United States Patent
Qian et al.

(10) Patent No.: US 11,746,438 B2
(45) Date of Patent: Sep. 5, 2023

(54) METHOD FOR PREPARING AN OPTICAL ZNS MATERIAL FROM ZINC AND SULFUR RAW MATERIAL SOURCES BY USING A FEEDING DEVICE TO REPLENISH THE SULFUR RAW MATERIAL SOURCE

(71) Applicants: Sinoma Synthetic Crystals Co., Ltd., Beijing (CN); Beijing Sinoma Synthetic Crystals Co., Ltd., Beijing (CN)

(72) Inventors: Xun Qian, Beijing (CN); Cunxin Huang, Beijing (CN); Hongtao Xiao, Beijing (CN); Xu Zhang, Beijing (CN); Kehong Zhang, Beijing (CN)

(73) Assignees: Sinoma Synthetic Crystals Co., Ltd., Beijing (CN); Beijing Sinoma Synthetic Crystals Co., Ltd., Beijing (CN)

( * ) Notice: Subject to any disclaimer, the term of this patent is extended or adjusted under 35 U.S.C. 154(b) by 0 days.

(21) Appl. No.: 17/547,730

(22) Filed: Dec. 10, 2021

(65) Prior Publication Data

US 2022/0186400 A1   Jun. 16, 2022

(30) Foreign Application Priority Data

Dec. 11, 2020  (CN) .......................... 202011457261.8

(51) Int. Cl.
*C30B 25/10*  (2006.01)
*C30B 29/46*  (2006.01)
(Continued)

(52) U.S. Cl.
CPC .............. *C30B 29/46* (2013.01); *C30B 25/00* (2013.01); *C30B 25/10* (2013.01); *C30B 35/002* (2013.01)

(58) Field of Classification Search
CPC .......... C30B 23/00; C30B 23/02; C30B 23/06; C30B 23/066; C30B 25/00; C30B 25/02;
(Continued)

(56) References Cited

U.S. PATENT DOCUMENTS 2,686,712 A * 8/1954 Estes .......................... C30B 7/00
                                                   23/302 R
5,383,969 A   1/1995 Teverovsky et al.
(Continued)

FOREIGN PATENT DOCUMENTS

CN     101649449 A  *  2/2010
CN     101649449 A     2/2010
(Continued)

OTHER PUBLICATIONS

Yang et al., Physical Properties of ZnS Thin Films Prepared by Low-temperature Sulfidation, Nuclear Physics Review, vol. 37, No. 3, Sep. 2020, and its English abstract, 5 pages.

*Primary Examiner* — Kenneth A Bratland, Jr.
(74) *Attorney, Agent, or Firm* — Bret E. Field; Bozicevic, Field & Francis LLP

(57) ABSTRACT

The present invention provides an optical ZnS material and a preparation method thereof, wherein the preparation method comprises: charging zinc and sulfur into a first crucible and a feeding device of a chemical vapor deposition furnace, respectively; heating the first crucible, the second crucible and a deposition chamber, and charging sulfur into the second crucible through the feeding device; introducing an inert carrier gas into the first crucible, and introducing an inert carrier gas and hydrogen into the second crucible, flowing the carrier gas containing zinc vapor and sulfur vapor respectively into the deposition chamber through pipelines to deposit ZnS, and supplying the second crucible with sulfur regularly and quantitatively through the feeding device during the deposition process to maintain a saturated (Continued)

vapor pressure of sulfur in a range of 0.8 to 1.8 KPa. The preparation method of the present invention does not generate $H_2S$; thus it can avoid the formation of hydrogen-zinc complexes by H ions produced from the decomposition of $H_2S$ and Zn vapor, which would otherwise affect the transmittance and emissivity of ZnS material.

9 Claims, 2 Drawing Sheets

(51) Int. Cl.
  *C30B 25/00* (2006.01)
  *C30B 35/00* (2006.01)
(58) Field of Classification Search
  CPC ......... C30B 25/10; C30B 25/14; C30B 25/16; C30B 25/165; C30B 29/00; C30B 29/10; C30B 29/46; C30B 29/48; C23C 14/06; C23C 14/0623; C23C 14/0629; C23C 14/24; C23C 14/246; C23C 16/22; C23C 16/30; C23C 16/305; C23C 16/306; C23C 16/448; C23C 16/4481
  USPC ..... 117/84, 88–89, 91, 93, 98–99, 102, 105, 117/107, 937, 956
  See application file for complete search history.

(56) References Cited

U.S. PATENT DOCUMENTS

| | | | | |
|---|---|---|---|---|
| 5,876,496 A | * | 3/1999 | Nagai | C30B 15/02 117/214 |
| 2005/0142289 A1 | * | 6/2005 | Robert Stiles | C23C 14/06 204/192.1 |
| 2016/0017486 A1 | * | 1/2016 | Goela | G02B 1/10 106/286.6 |
| 2018/0298485 A1 | * | 10/2018 | Zou | C23C 14/246 |

FOREIGN PATENT DOCUMENTS

| CN | 205856602 U | 1/2017 |
|---|---|---|
| CN | 107119322 A | 9/2017 |
| CN | 107119323 A | 9/2017 |
| CN | 109207956 A | 1/2019 |

* cited by examiner

METHOD FOR PREPARING AN OPTICAL ZNS MATERIAL FROM ZINC AND SULFUR RAW MATERIAL SOURCES BY USING A FEEDING DEVICE TO REPLENISH THE SULFUR RAW MATERIAL SOURCE

FIELD OF THE INVENTION

The present invention relates to the technical field of infrared optical materials, and in particular to an optical ZnS material and preparation method thereof.

BACKGROUND OF THE INVENTION

Infrared optical materials include windows and lens materials at ambient temperature, relative higher and lower temperatures, and are often used in optical windows of infrared detection systems. In high-speed flight environment, the optical window of an infrared detection system exposed to atmosphere will bear extremely harsh dual loads of aerodynamic force and aerodynamic heat. Aerodynamic heating may cause the temperature of optical windows to rise sharply, resulting in window thermal radiation effect, which may saturate the photodetector in severe cases. If the thermodynamic properties of a window material cannot withstand the aerodynamic load and aerothermal load, the entire imaging system may be damaged. Accordingly, for optical windows used on high-speed aircrafts, the window material should have a high-transmission and low-radiation performance in the working waveband, in addition to an excellent thermodynamic property.

Chemical vapor deposited zinc sulfide (CVDZnS) is an important long-wave infrared transmitting material with a transmittance range of 0.35-14.5 μm. It has a good transmittance at 840 μm, and an average transmittance thereof can be 73% or more. In addition, it has stable optical properties, and its transmittance is basically unchanged at a temperature of 400° C. or less. In terms of mechanical properties, CVDZnS is composed of fine grains, having relatively high fracture strength and hardness as well as high erosion resistance. CVDZnS can be used at a temperature of up to 800° C., and has a good thermal shock resistance.

In the prior art, CVDZnS is generally obtained by chemical vapor deposition using Zn vapor and $H_2S$ gas as raw materials. The reaction equation is:

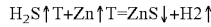
$H_2S\uparrow T+Zn\uparrow T=ZnS\downarrow +H_2\uparrow$

The inventors discover that the existing CVDZnS preparation methods produce a large number of highly active H ions due to the decomposition of $H_2S$ during the reaction, and these H ions compound with Zn vapor to form complicated hydrogen-zinc complexes which deposit in ZnS, thus leading to higher scattering and lower transmittance of the ZnS material. Furthermore, due to the excessive internal impurities in this ZnS material, the long-wave band emissivity of the ZnS material is also as high as 0.3 or more, leading to an excessively high long-wave emissivity and a reduced transmittance of the ZnS material at high temperature. Accordingly, it can only be used at a temperature of about 200° C., which limits the application of ZnS material under higher temperature.

SUMMARY OF THE INVENTION

The object of the present invention is to provide an optical ZnS material and a preparation method thereof, which can reduce the emissivity of CVDZnS materials and increase the application temperature of CVDZnS materials. The specific technical solutions are as follows.

In a first aspect, the present invention provides a method for preparing an optical ZnS material, comprising:

charging a zinc raw material and a sulfur raw material into a first crucible and a feeding device of a chemical vapor deposition furnace respectively, wherein the feeding device is in communication with a second crucible of the chemical vapor deposition furnace, and the first crucible and the second crucible are located in different furnace bodies of the chemical vapor deposition furnace;

heating the first crucible, the second crucible and a deposition chamber of the chemical vapor deposition furnace, and charging sulfur into the second crucible through the feeding device after the first crucible is heated to 560-640° C., the second crucible is heated to 230-290° C. and the deposition chamber is heated to 560-640° C.; and introducing an inert carrier gas into the first crucible and a mixed gas of an inert carrier gas and hydrogen into the second crucible after the zinc and the sulfur are melted, flowing the carrier gases containing zinc vapor and sulfur vapor respectively into the deposition chamber through pipelines to deposit ZnS on a deposition substrate in the deposition chamber, and supplying the sulfur to the second crucible through the feeding device during the deposition process regularly and quantitatively, to maintain a saturated vapor pressure of sulfur in a range of 0.8 to 1.8 KPa.

In an embodiment of the present invention, a heating rate of the first crucible and the deposition chamber is 0.6 to 1.4° C./min, a heating rate of a bottom of the second crucible is 0.15 to 0.3° C./min, and a heating rate of a side wall of the second crucible is 0.1 to 0.3° C./min In an embodiment of the present invention, a flow rate of the inert carrier gas introduced into the first crucible is 0.2 to 0.8 L/min, a flow rate of the inert carrier gas introduced into the second crucible is 0.4 to 1.0 L/min, and a flow rate of the hydrogen introduced into the second crucible is 0.7 to 1.3 L/min.

In an embodiment of the present invention, the inert carrier gas is argon or helium.

In an embodiment of the present invention, the inert carrier gas introduced into the first crucible is different from the inert carrier gas introduced into the second crucible.

In an embodiment of the present invention, a feeding control unit in the feeding device is utilized to control the opening and closing of a solenoid valve located at an outlet of a feeding unit, so as to supply the second crucible with sulfur regularly and quantitatively.

In an embodiment of the present invention, a molar ratio between Zn vapor and S vapor introduced into the deposition chamber is 1.05:1 to 1.4:1.

In an embodiment of the present invention, during the deposition process, a pressure in the deposition chamber is 2 to 7 kPa.

In an embodiment of the present invention, a plurality of the deposition substrate in the deposition chamber are arranged vertically and spaced apart by a certain distance.

In a second aspect, the present invention provides an optical ZnS material prepared by the method for preparing optical ZnS material according to the first aspect described above, and the optical ZnS material has an emissivity of 0.01 to 0.1 at 200° C. to 400° C. within an infrared band of 8 to 10.5 μm.

In an embodiment of the present invention, the optical ZnS material has an average transmittance of ≥71% at room temperature for an infrared band of 2.5 to 10.5 μm.

Beneficial effects of the present invention:

The present invention provides an optical ZnS material and a preparation method thereof, which uses Zn raw material and S raw material to produce CVDZnS material via chemical vapor deposition, and supplies sulfur during the deposition process to maintain a saturated vapor pressure of sulfur in the range of 0.8 to 1.8 KPa, thus controlling the deposition rate of sulfur in the deposition chamber and improving the optical quality of the reaction product. Since the preparation method of the present invention does not generate $H_2S$, it can avoid the formation of hydrogen-zinc complexes by H ions produced from the decomposition of $H_2S$ with Zn vapor, which would otherwise affect the transmittance and emissivity of ZnS material. The CVDZnS material prepared according to the present invention has the characteristics of low emissivity, so that the CVDZnS material can be applied under higher temperature conditions and the application of the CVDZnS material is expanded. Obviously, however, the implementation of any product or method of the present invention does not necessarily need to achieve all the advantages described above at the same time.

BRIEF DESCRIPTION OF THE DRAWINGS

In order to describe the technical solutions of the examples of the present invention or that of the prior art more clearly, the drawings related to the description of the examples or the prior art will be introduced briefly in the following. Obviously, the drawings in the following descriptions are only some examples of the present invention. For those skilled in the art, other drawings can be obtained based on these drawings without creative work.

In the drawings.

Figure 1:
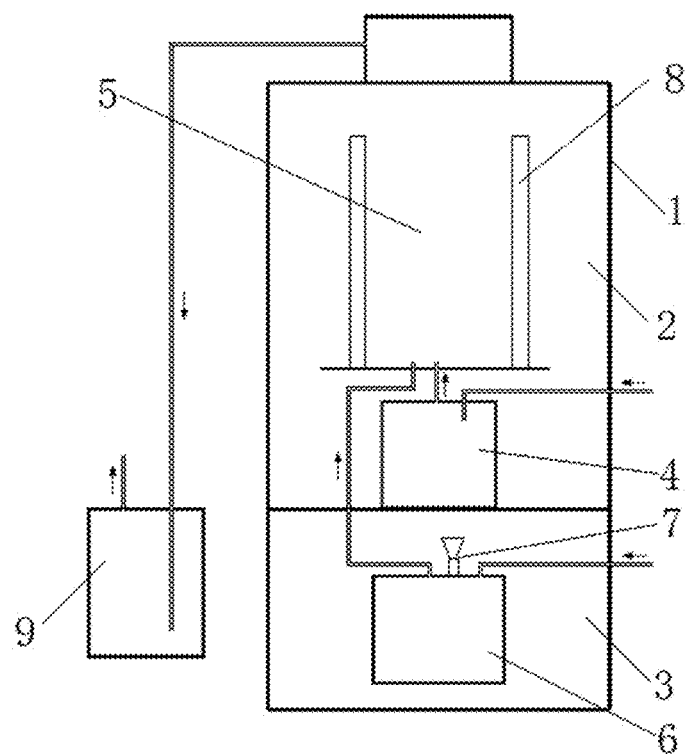
FIG. 1 is a schematic structural diagram of CVD equipment according to an embodiment of the present invention.

1. main body of the deposition furnace; 2. first furnace body; 3. second furnace body; 4. first crucible; 5. deposition chamber; 6. second crucible; 7. feeding device; 8. deposition substrate; 9. vacuum pump; 71. feeding unit; 72. solenoid valve.

DETAILED DESCRIPTION OF EMBODIMENTS OF THE INVENTION

The technical solutions in the examples of the present invention will be clearly and fully described below in conjunction with the accompanying drawings in the examples of the present invention. Obviously, the described examples are only part of the examples of the present invention, not all of the examples. Based on the examples in the present invention, all other examples obtained by those skilled in the art without creative work shall fall within the protection scope of the present invention.

The present invention provides a method for preparing an optical ZnS material, comprising:

charging a zinc raw material and a sulfur raw material respectively into a first crucible and a feeding device of a chemical vapor deposition furnace;

heating the first crucible, a second crucible and a deposition chamber of the chemical vapor deposition furnace, and charging sulfur into the second crucible through the feeding device after the first crucible is heated to 560-640° C., the second crucible is heated to 230-290° C. and the deposition chamber is heated to 560-640° C.; and introducing an inert carrier gas into the first crucible and a mixed gas of an inert carrier gas and hydrogen into the second crucible after the zinc and the sulfur are melted, flowing the carrier gases containing zinc vapor and sulfur vapor respectively into the deposition chamber through pipelines to deposit ZnS on a deposition substrate in the deposition chamber, and supplying the sulfur to the second crucible through the feeding device during the deposition process regularly and quantitatively, to maintain a saturated vapor pressure of sulfur in the range of 0.8 to 1.8 KPa.

The feeding device of the present invention is in communication with the second crucible of the chemical vapor deposition furnace. The first crucible and the second crucible are respectively located in different furnace bodies of the chemical vapor deposition furnace. The specific structure of the chemical vapor deposition furnace is shown below.

In the present invention, the first crucible in a first furnace body is used to hold zinc, and the material thereof may be one that does not react with zinc, for example, graphite. The second crucible in a second furnace body is used to hold sulfur, and the material thereof may not react with sulfur, for example, stainless steel. The zinc raw material and sulfur raw material mentioned in the present invention may refer to elemental zinc and elemental sulfur.

In the present invention, the temperature of the first crucible is controlled to be 560° C. to 640° C., preferably 560° C. to 600° C. The temperature of the second crucible is controlled to be 230° C. to 290° C., preferably 230° C. to 250° C. The inventors find that, without being bound by any theory, when the temperature of the first crucible and the second crucible is too low, the zinc raw material and the sulfur raw material therein will be difficult/challenging to melt effectively. When the temperature of the first crucible and the second crucible is too high, the zinc raw material and the sulfur raw material therein will be evaporated too fast, thus affecting the amount of zinc vapor and sulfur vapor entered into the deposition chamber, and further affecting the ZnS deposition rate.

In the present invention, by controlling the temperature of the deposition chamber to 560° C. to 640° C., preferably 600° C. to 640° C., ZnS is deposited on the deposition substrate at a suitable deposition rate to obtain a high-quality CVDZnS.

In an embodiment of the present invention, a heating rate of the first crucible and the deposition chamber is 0.6 to 1.4° C./min, a heating rate of a bottom of the second crucible is 0.15 to 0.3° C./min, and a heating rate of a side wall of the second crucible is 0.1 to 0.3° C./min Since a predetermined temperature of the first crucible and the deposition chamber is higher, by controlling a higher heating rate of the first crucible and the deposition chamber, the first crucible and the deposition chamber can reach the predetermined temperature quickly, thus improving the production efficiency of CVDZnS.

In an embodiment of the present invention, the inert carrier gas is argon or helium.

The carrier gas entering into the first crucible may be an inert carrier gas, and the carrier gas entering into the second crucible may be a mixed gas of an inert carrier gas and hydrogen.

In an embodiment of the present invention, the carrier gas entering into the first crucible may be argon or helium, and the carrier gas entering into the second crucible may be a mixed gas of argon and hydrogen. Although the carrier gas of the present invention contains hydrogen, based on thermodynamic calculations, under the condition of maintaining a temperature of the second crucible and the deposition chamber as described above, the hydrogen does not react with sulfur to generate hydrogen sulfide (a decomposition reaction of hydrogen sulfide will occur at this time), thereby avoiding the generation of H ions.

In an embodiment of the present invention, the inert carrier gas introduced into the first crucible is different from the inert carrier gas introduced into the second crucible. For example, when the inert carrier gas introduced into the first crucible is argon, the inert carrier gas introduced into the second crucible is helium.

In an embodiment of the present invention, a molar ratio between Zn vapor and S vapor introduced into the deposition chamber is 1.05:1 to 1.4:1. By controlling the molar ratio between Zn vapor and S vapor to above range, sulfur and zinc can better react to produce ZnS on the deposition substrate, thereby obtaining CVDZnS with high optical quality.

In an embodiment of the present invention, during the deposition process, a pressure in the deposition chamber is 2 to 7 kPa. By controlling the pressure in the deposition chamber to above range, CVDZnS with better optical quality can be obtained.

In an embodiment of the present invention, a plurality of the deposition substrates in the deposition chamber are arranged vertically and spaced apart by a certain distance. For example, a plurality of deposition substrates is arranged to space apart by 20-50 cm, so as to ensure a good deposition effect.

It is to be understood that a deposition thickness of CVDZnS is related to a deposition duration. Therefore, the deposition thickness of CVDZnS can be controlled by controlling the deposition duration. Usually, the deposition duration is controlled to 15 to 25 days to obtain CVDZnS with a suitable thickness.

After the CVDZnS material is prepared, an optical window can be obtained through existing processing procedures for CVDZnS material including blank cutting→blank forming→grinding processing→polishing→cleaning. The specific processes are based on the prior art, and will not be repeated in the present invention.

The CVD equipment of the present invention is described below.

As shown in FIG. 1, the CVD equipment for preparing optical ZnS material according to the present invention comprises: a main body of deposition furnace 1, and a first furnace body 2 and a second furnace body 3 separately arranged inside the main body of deposition furnace 1; a first crucible 4 and a deposition chamber 5 arranged inside the first furnace body 2, a second crucible 6 and a feeding device 7 arranged inside the second furnace body 3, wherein the first crucible 4 is used to hold, heat and evaporate zinc, the second crucible 6 is used to hold, heat and evaporate sulfur, and the feeding device 7 is used to regularly and quantitatively charge sulfur to the second crucible 6 to control the evaporation rate and evaporation amount of sulfur;

the deposition chamber 5 is located above the first crucible 4 and is in communication with the first crucible 4 and the second crucible 6 through pipelines respectively.

The main body of the deposition furnace of the present invention may include two furnace bodies, called the first furnace body and the second furnace body. The first furnace body is a main furnace body, and the second is an auxiliary furnace body. Both furnace bodies can be equipped with temperature control devices to monitor and control the temperature therein. The first furnace body and the second furnace body are arranged separately, so that the temperature of the two furnace bodies can be separately controlled by temperature control devices. The temperature control device of the present invention can be existing temperature control devices, and are not specifically defined in the present invention.

Figure 2:
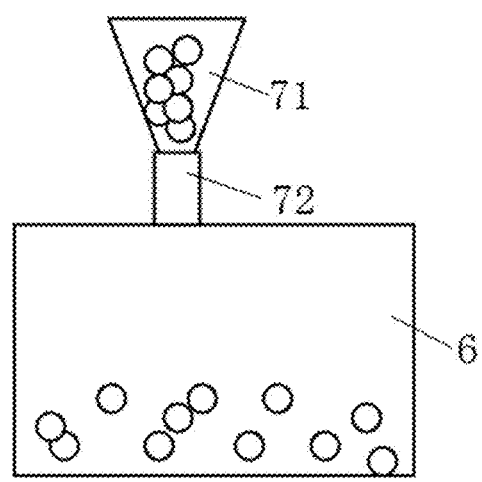
FIG. 2 is a schematic structural diagram of a feeding device according to an embodiment of the present invention.

FIG. 2 shows a schematic structural diagram of the feeding device 7 in an embodiment of the present invention. This feeding device comprises a feeding unit 71 and a feeding control unit (not shown in the figure). The feeding control unit controls the solenoid valve 72 located at an outlet of the feeding unit 71, controlling the regular and quantitative charging of sulfur raw material to the second crucible by controlling the opening and closing of the solenoid valve as well as the opening period. In the present invention, the feeding control unit is not specifically defined, provided that the solenoid valve can be controlled to open regularly. For example, the above-mentioned control unit can be obtained from an existing programmable controller.

In research work, the inventors find that, in the CVDZnS deposition process, controlling the evaporation amount of sulfur may significantly affect both the deposition rate of ZnS and the optical quality of ZnS material, because the amount of sulfur carried by the carrier gas and the intake amount of sulfur into the deposition chamber are both related to the saturated vapor pressure at the evaporation temperature. The vapor pressure of a solid substance changes sensitively to temperature, usually exponentially, and has a very close relationship with the controlling of temperature. In production practice, the feeding amount of sulfur is up to several tens to hundreds of kilograms, and the diameter of the second crucible for holding sulfur is 0.2 to 0.8 meters. In addition, as the ZnS deposition progresses, the sulfur raw material is continuously consumed, causing the sulfur level in the second crucible dropping, while the height of the carrier gas outlet is fixed. Accordingly, the amount of sulfur raw material carried by the carrier gas changes, leading to an inconsistent discharge amount of sulfur in the early and late stages of the deposition and then affecting the optical quality of the CVDZnS material.

In the CVDZnS deposition process, the relationship between a vapor pressure of the raw material and temperature is as follows:

$$\lg(P/kPa) = A \times 10^3 T^{-1} + B \lg T + C \times 10^{-3} T + D$$

wherein,

A, B, C and D respectively represent a vapor pressure constant of the reactant at different temperatures, and T represents temperature.

The constants A, B, C and D of the reactant are shown in Table 1. The correlation curve between a saturated vapor pressure of sulfur and temperature calculated according to the above equation is shown in FIG. 3.

TABLE 1

| Material | A | B | C | D | Temperature range/K |
|---|---|---|---|---|---|
| The constants A, B, C, D of reactant sulfur | | | | | |
| 1 g (P/kPa) | | | | | |
| $<S_x>$ | −4.830 | −5.0 | — | 23.00 | Melting point-boiling point |

Figure 3:
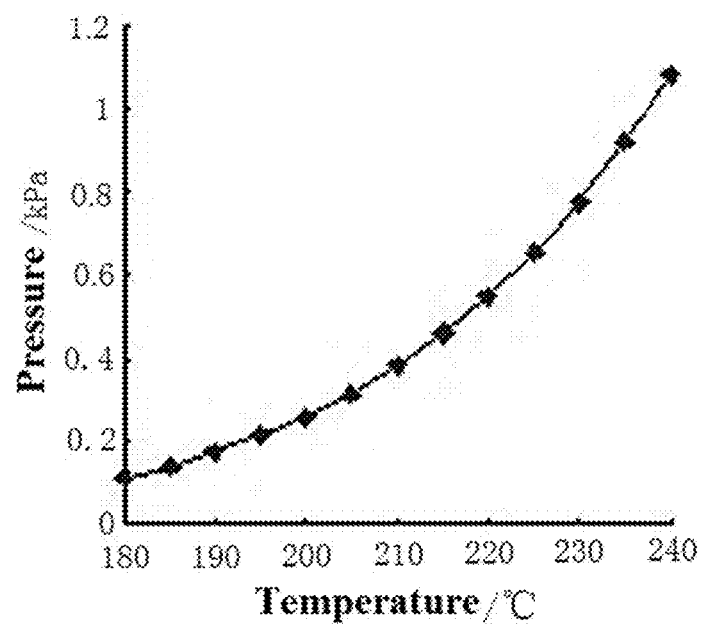
FIG. 3 is a graph showing sulfur vapor pressure as a function of temperature.

The relationship between a saturated vapor pressure of sulfur and a temperature can be seen in FIG. 3. To maintain a saturated vapor pressure of sulfur in a range of 0.8 to 1.8 KPa, the present invention designs a feeding device for the second crucible.

The principle of the feeding device is to regularly and quantitatively charge sulfur raw material into the second crucible, instead of directly charging in one portion. Specifically, a feed inlet is added at the upper opening of the first crucible, and a solenoid valve is arranged at the feed inlet to control the opening and closing of the solenoid valve. Usually the solenoid valve is closed, but it can be opened regularly for a fixed period. A certain amount of sulfur raw material above the solenoid valve can fall through the valve during the opening of the valve. By adjusting the diameter of the solenoid valve and the opening period, a fixed amount of sulfur raw material can fall through valve within a fixed period, thereby avoiding the large fluctuation of vapor pressure caused by the temperature change arising from the lowering of the liquid level in the first crucible, thus avoiding the excessive variation of reactant concentration and the impact on the optical quality of ZnS material.

In the present invention, sulfur can be regularly and quantitatively charged to the second crucible through the feeding device. Specifically, a certain weight of sulfur can be charged into the second crucible at regular intervals. Therefore, the evaporation rate and evaporation amount of sulfur can be controlled; thereby the amount of sulfur entering into the deposition chamber can be controlled, so as to control the deposition rate of sulfur, which is more conducive to obtaining high-performance CVDZnS.

Exemplarily, the solenoid valve can be opened every 30 s, 1 min, 5 min, 30 min, 60 min, 5 h, 10 h or 24 h, and the period for opening the solenoid valve each time can be 0.5 s, 1 s, 2 s, 5 s or 10 s. In such way, sulfur is charged to the second crucible regularly and quantitatively.

The material for the deposition substrate of the present invention is graphite, specifically a high-strength, high-density, and high-purity graphite, for example, graphite having a bulk density of 1.7 to 1.9 g/cm, a flexural strength of 30 to 40 MPa, a tensile strength of 20 to 30 MPa, and a carbon content of 99. 99% or more.

As shown in FIG. 1, the CVD equipment of the present invention may further include a vacuum pump 9, which is in communication with the main body of the deposition furnace through a pipeline for vacuuming the furnace body. The CVD equipment of the present invention may further include an exhaust gas treatment device (not shown in the figure) for treating the exhaust gas discharged from the equipment, thereby protecting the environment.

The present invention provides an optical ZnS material and a preparation method thereof, which uses Zn raw material and S raw material to produce CVDZnS material via chemical vapor deposition, and supplements sulfur during the deposition process to maintain a saturated vapor pressure of sulfur in the range of 0.8 to 1.8 KPa, thus controlling the deposition rate of sulfur in the deposition chamber and improving the optical quality of the reaction product. Since the preparation method of the present invention does not generate $H_2S$, it can avoid the formation of hydrogen-zinc complexes by H ions produced from the decomposition of $H_2S$ and Zn vapor, which would otherwise affect the transmittance and emissivity of ZnS material. The CVDZnS material prepared according to the present invention has the characteristics of low emissivity, so that the CVDZnS material can be applied under higher temperature conditions and the application of the material is expanded.

Hereinafter, embodiments of the present application are described in more detail with reference to examples and comparative examples. The various tests and evaluations are performed according to the following methods. In addition, "parts" and "%" are based on weight, unless otherwise specified.

EXAMPLE 1

<The Preparation of CVDZnS Material>

100 kg of zinc raw material and 60 kg of sulfur raw material were charged into the first crucible and the feeding device of the chemical vapor deposition furnace, respectively.

The first crucible, the second crucible and the deposition chamber were heated, wherein a heating rate of the first crucible and the deposition chamber was 0.6° C./min, a heating rate of a bottom of the second crucible was 0.15° C./min, and a heating rate of a side wall of the second crucible was 0.1° C./min After the first crucible was heated to 560° C., the second crucible was heated to 230° C. and the deposition chamber was heated to 600° C., the solenoid valve of the feeding device was opened and 60 kg of sulfur was charged into the second crucible through the feeding device.

After the zinc in the first crucible and the sulfur in the second crucible were melted, carrier gas argon was introduced into the first crucible, and a mixed gas of carrier gas argon and hydrogen was introduced into the second crucible, so that the carrier gas containing zinc vapor entered into the deposition chamber through a first pipeline, the carrier gas containing sulfur vapor entered into the deposition chamber through a second pipeline, and ZnS was deposited on a graphite substrate of the deposition chamber, wherein, a flow rate of the argon introduced into the first crucible was 0.2 L/min, a flow rate of the argon introduced into the second crucible was 0.4 L/min, a flow rate of the hydrogen introduced into the second crucible was 0.7 L/min, and a molar ratio between Zn vapor and S vapor introduced into the deposition chamber was 1.15:1.

The temperature of the first crucible, the second crucible and the deposition chamber were maintained under the above temperature and the deposition duration was set to be 25 days. During the deposition process, 0.001 kg of sulfur was supplemented to the second crucible every 30 s through the feeding device to maintain a saturated vapor pressure of sulfur to about 0.8 kPa.

After a predetermined time, the furnace was shut down and heating was stopped. When the temperature of the first crucible dropped below the melting point of zinc (about 400° C.), the flowmeter for the zinc-carrying argon was turned off; when the temperature of the second crucible dropped below the melting point of sulfur (about 100° C.), the flowmeter for the sulfur-carrying argon and hydrogen was turned off, and then the carrier gas pipelines were closed.

The CVD equipment was opened, and the graphite substrate was taken out. A CVDZnS raw blank was removed from the graphite substrate, which has a thickness of about 30 mm <The Preparation of Optical Window>

An optical window with a thickness of 5 mm was obtained through blank cutting→blank forming→grinding processing→polishing→cleaning of the obtained CVDZnS raw blank.

EXAMPLE 2

<The Preparation of CVDZnS Material>

100 kg of zinc raw material and 60 kg of sulfur raw material were charged into the first crucible and the feeding device of the chemical vapor deposition furnace, respectively.

The first crucible, the second crucible and the deposition chamber were heated, wherein a heating rate of the first crucible and the deposition chamber was 1.0° C./min, a heating rate of a bottom of the second crucible was 0.2° C./min, and a heating rate of a side wall of the second crucible was 0.2° C./min.

After the first crucible was heated to 580° C., the second crucible was heated to 240° C. and the deposition chamber was heated to 610° C., the solenoid valve of the feeding device was opened and 60 kg of sulfur was charged into the second crucible through the feeding device.

After the zinc in the first crucible and the sulfur in the second crucible were melted, carrier gas argon was introduced into the first crucible, and a mixed gas of carrier gas argon and hydrogen was introduced into the second crucible, so that the carrier gas containing zinc vapor entered into the deposition chamber through a first pipeline, the carrier gas containing sulfur vapor entered into the deposition chamber through a second pipeline, and ZnS was deposited on a graphite substrate of the deposition chamber, wherein, a flow rate of the argon introduced into the first crucible was 0.5 L/min, a flow rate of the argon introduced into the second crucible was 0.8 L/min, a flow rate of the hydrogen introduced into the second crucible was 1.0 L/min, and a molar ratio between Zn vapor and S vapor introduced into the deposition chamber was 1.15:1.

The temperature of the first crucible, the second crucible and the deposition chamber were maintained under the above temperature conditions and the deposition duration was set to be 20 days. During the deposition process, 0.0015 kg of sulfur was supplemented to the second crucible every 30 s through the feeding device to maintain a saturated vapor pressure of sulfur to about 1.1 kPa.

After a predetermined time, the furnace was shut down and heating was stopped. When the temperature of the first crucible dropped below the melting point of zinc (about 400° C.), the flowmeter for the zinc-carrying argon was turned off; when the temperature of the second crucible dropped below the melting point of sulfur (about 100° C.), the flowmeter for the sulfur-carrying argon and hydrogen was turned off, and then the carrier gas pipelines were closed.

The CVD equipment was opened, and the graphite substrate was taken out. A CVDZnS raw blank was removed from the graphite substrate, which has a thickness of about 25 mm <The Preparation of Optical Window>

The same method as in Example 1 was adopted to prepare optical window.

EXAMPLE 3

<The Preparation of CVDZnS Material>

100 kg of zinc raw material and 60 kg of sulfur raw material were charged into the first crucible and the feeding device of the chemical vapor deposition furnace, respectively.

The first crucible, the second crucible and the deposition chamber were heated, wherein a heating rate of the first crucible and the deposition chamber was 1.4° C./min, a heating rate of a bottom of the second crucible was 0.3° C./min, and a heating rate of a side wall of the second crucible was 0.3° C./min.

After the first crucible was heated to 600° C., the second crucible was heated to 250° C. and the deposition chamber was heated to 640° C., the solenoid valve of the feeding device was opened and 60 kg of sulfur was charged into the second crucible through the feeding device.

After the zinc in the first crucible and the sulfur in the second crucible were melted, carrier gas argon was introduced into the first crucible, and a mixed gas of carrier gas argon and hydrogen was introduced into the second crucible, so that the carrier gas containing zinc vapor entered into the deposition chamber through a first pipeline, the carrier gas containing sulfur vapor entered into the deposition chamber through a second pipeline, and ZnS was deposited on a graphite substrate of the deposition chamber, wherein, a flow rate of the argon introduced into the first crucible was 0.8 L/min, a flow rate of the argon introduced into the second crucible was 1.0 L/min, a flow rate of the hydrogen introduced into the second crucible was 1.0 L/min, and a molar ratio between Zn vapor and S vapor introduced into the deposition chamber was 1.15:1.

The temperature of the first crucible, the second crucible and the deposition chamber were maintained under the above temperature conditions and the deposition duration was set to be 15 days. During the deposition process, 0.002 kg of sulfur was supplemented to the second crucible every 30 s through the feeding device to maintain a saturated vapor pressure of sulfur to about 1.7 kPa.

After a predetermined time, the furnace was shut down and heating was stopped. When the temperature of the first crucible dropped below the melting point of zinc (about 400° C.), the flowmeter for the zinc-carrying argon was turned off; when the temperature of the second crucible dropped below the melting point of sulfur (about 100° C.), the flowmeter for the sulfur-carrying argon and hydrogen was turned off, and then the carrier gas pipelines were closed.

The CVD equipment was opened, and the graphite substrate was taken out. A CVDZnS raw blank was removed from the graphite substrate, which has a thickness of about 20 mm <The Preparation of Optical Window>

The same method as in Example 1 was adopted to prepare optical window.

Comparative Example 1

Zn vapor and $H_2S$ were used as raw materials to react and produce CVDZnS, wherein the temperature of the crucible area of Zn raw material and the deposition area was controlled to 650° C. Zinc vapor and $H_2S$ diluted with argon were respectively charged into the deposition chamber via nozzles, wherein a molar ratio between Zn and H₂S was controlled to be 1.15:1, a pressure of the deposition chamber was controlled to about 5000 Pa, and the deposition duration was set for 20 days.

The CVD equipment was opened, and the deposition substrate was taken out. A CVDZnS raw blank was removed from the deposition substrate, which has a thickness of about 20 mm The same method as in Example 1 was adopted to prepare optical window.

The performance parameters of the CVDZnS raw blanks of Examples 1-3 and Comparative Example 1 are shown in Table 2.

TABLE 2

Performance parameters of the CVDZnS raw blanks of Examples 1-3 and Comparative Example 1

| | Thickness (mm) | Emissivity (8~10.5 μm, 300° C.) | RT Average transmissivity to infrared band of 8 to 10.5 μm |
|---|---|---|---|
| Example 1 | 30 | 0.019 | 72.5 |
| Example 2 | 25 | 0.021 | 71.7 |
| Example 3 | 20 | 0.02 | 72.1 |
| Comparative Example 1 | 20 | 0.21 | 70.1 |

As can be seen from Examples 1-3 and Comparative Example 1, the CVDZnS of the present invention exhibits a lower emissivity than the CVDZnS of the comparative example and a higher room temperature average transmittance to an infrared band of 8 to 10.5 μm, indicating that the CVDZnS of the present invention has a more excellent optical performance.

It can be seen from Example 3 and Comparative Example 1 that under the same CVDZnS thickness, the CVDZnS of the present invention has a more excellent optical performance.

Figure 4A:
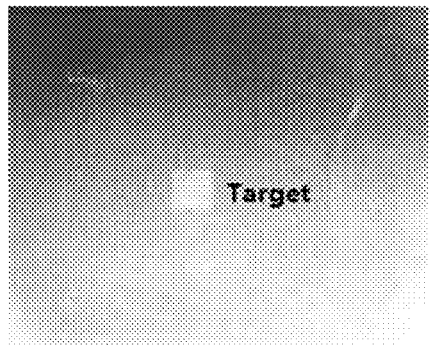
FIG. 4A is an infrared imaging picture, at a high temperature of 400° C., of a CVDZnS optical window prepared in Comparative Example 1.
Figure 4B:
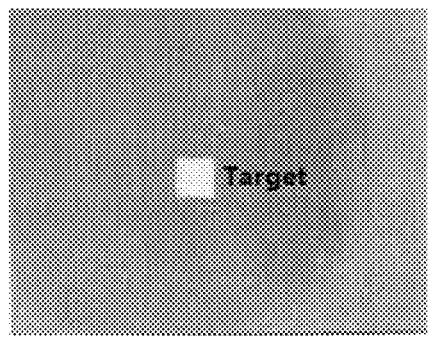
FIG. 4B is an infrared imaging picture, at a high temperature of 400° C., of CVDZnS optical window prepared in Example 2 of the present invention.

FIG. 4A is an infrared imaging picture (infrared band of 8 to 10.5 μm), at a high temperature of 400° C., of the CVDZnS prepared in Comparative Example 1 from Zn vapor and H₂S; FIG. 4B is an infrared imaging picture (infrared band of 8 to 10.5 μm), at a high temperature of 400° C., of the CVDZnS prepared in Example 2 of the present invention.

As can be seen from FIG. 4A and FIG. 4B, the image of CVDZnS prepared from Zn vapor and H₂S is not only blurred, but also has an obvious uneven brightness phenomenon, which seriously affects the recognition and location of target (white square in the figure). However, the CVDZnS prepared by the CVD equipment of the present invention has a clear and bright image at 400° C., the target (white square in the figure) has sharp edges and contrasts with background, providing excellent target recognition.

The descriptions above are only preferred examples of the present invention, and are not intended to limit the protection scope of the present invention. Any modification, equivalent replacement, improvement, etc., made within the spirit and principle of the present invention are all encompassed by the protection scope of the present invention.

The invention claimed is:

1. A method for preparing an optical ZnS material, comprising:
charging a zinc raw material and a sulfur raw material into a first crucible and a feeding device of a chemical vapor deposition furnace respectively, wherein the feeding device is in communication with a second crucible of the chemical vapor deposition furnace, and the first crucible and the second crucible are located in different furnace bodies of the chemical vapor deposition furnace;
heating the first crucible, the second crucible and a deposition chamber of the chemical vapor deposition furnace, and charging the sulfur into the second crucible through the feeding device after the first crucible is heated to 560-640° C., the second crucible is heated to 230-290° C. and the deposition chamber is heated to 560-640° C.;
introducing an inert carrier gas into the first crucible and a mixed gas of an inert carrier gas and hydrogen into the second crucible after the zinc and the sulfur are melted, flowing the carrier gases containing a zinc vapor and a sulfur vapor respectively into the deposition chamber through pipelines to deposit ZnS on a deposition substrate in the deposition chamber, and supplying the sulfur to the second crucible through the feeding device during the deposition process regularly and quantitatively, to maintain a saturated vapor pressure of sulfur in a range of 0.8 to 1.8 KPa; and
wherein the feeding device comprises a feeder and a feeding controller.

2. The method according to claim 1, wherein a heating rate of the first crucible and the deposition chamber is 0.6 to 1.4° C./min, a heating rate of a bottom of the second crucible is 0.15 to 0.3C./min, and a heating rate of a side wall of the second crucible is 0.1 to 0.3° C./min.

3. The method according to claim 1, wherein a flow rate of the inert carrier gas introduced into the first crucible is 0.2 to 0.8 L/min, a flow rate of the inert carrier gas introduced into the second crucible is 0.4 to 1.0 L/min, and a flow rate of the hydrogen introduced into the second crucible is 0.7 to 1.3 L/min.

4. The method according to claim 1, wherein the inert carrier gas is argon or helium.

5. The method according to claim 1, wherein the inert carrier gas introduced into the first crucible is different from the inert carrier gas introduced into the second crucible.

6. The method according to claim 1, wherein the feeding controller the feeding device is utilized to control the opening and closing of a solenoid valve located at an outlet of the feeder, so as to supply the second crucible with sulfur regularly and quantitatively.

7. The method according to claim 1, wherein a molar ratio between the zinc vapor and the sulfur vapor introduced into the deposition chamber is 1.05:1 to 1.4:1.

8. The method according to claim 1, wherein a pressure in the deposition chamber is 2 to 7 kPa during the deposition process.

9. The method according to claim 1, wherein a plurality of the deposition substrates in the deposition chamber are arranged vertically and spaced apart by a certain distance.

* * * * *